(12) United States Patent
Danel

(10) Patent No.: US 7,101,773 B2
(45) Date of Patent: Sep. 5, 2006

(54) METHOD OF PRODUCING A CONTACT SYSTEM ON THE REAR OF A COMPONENT WITH STACKED SUBSTRATES

(75) Inventor: Jean-Sébastien Danel, Echirolles (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/490,468

(22) PCT Filed: Sep. 20, 2002

(86) PCT No.: PCT/FR02/03225

§ 371 (c)(1),
(2), (4) Date: Mar. 23, 2004

(87) PCT Pub. No.: WO03/028101

PCT Pub. Date: Apr. 3, 2003

(65) Prior Publication Data

US 2005/0020029 A1  Jan. 27, 2005

(30) Foreign Application Priority Data

Sep. 24, 2001 (FR) .................................. 01 12263

(51) Int. Cl.
*H01L 21/30* (2006.01)
(52) U.S. Cl. ................ 438/455; 438/618; 257/E21.505
(58) Field of Classification Search ................ 438/598, 438/612, 455, 456, 618, 459; 257/E21.505
See application file for complete search history.

(56) References Cited

U.S. PATENT DOCUMENTS

| 5,987,989 | A | 11/1999 | Yamamoto et al. |
| 6,065,341 | A | 5/2000 | Ishio et al. |
| 6,338,284 | B1 | 1/2002 | Najafi et al. |
| 6,894,358 | B1 * | 5/2005 | Leib et al. .................. 257/414 |

FOREIGN PATENT DOCUMENTS

| DE | 199 62 231 A1 | 7/2001 |
| EP | 0 611 967 A1 | 8/1994 |
| FR | 2 754 386 A1 | 4/1998 |

OTHER PUBLICATIONS

International Search Report, for International Application No. PCT/FR02/03225, date mailed Sep. 23, 2003.

* cited by examiner

*Primary Examiner*—Bradley K. Smith
(74) *Attorney, Agent, or Firm*—Thelen Reid & Priest LLP

(57) ABSTRACT

The present invention relates to a process for making a contact point (8) on the rear surface of a component including at least one first substrate (10) with at least one active region (12) and at least one second substrate (20) for protecting the active region. In accordance with the invention, a second substrate of a non-insulating material is used and at least one through insulation trench (21) is made in it surrounding a part (22) of this substrate, said part being in contact with the active region when the first and second substrates are assembled.

Application to sensor conditioning.

20 Claims, 2 Drawing Sheets

METHOD OF PRODUCING A CONTACT SYSTEM ON THE REAR OF A COMPONENT WITH STACKED SUBSTRATES

Cross-Reference to Related Application

This application claims priority based on International Patent Application No. PCT/FR02/103225, entitled "Process for Making a Contact Point on the Rear surface of a Component with Stacked Substrates and a Component Fitted with Such a Contact Point" by Jean-Sebastien Danel, which claims priority of French application no. 01 12263, filed on Sep. 24, 2001, and which was not published in English.

TECHNICAL FIELD

The present invention relates to a process for making a contact point on the rear surface of a component with stacked substrates. It also relates to a component fitted with such a contact point.

The invention relates particularly to components that include a sensor or any sensitive part on a first free surface. The rear surface is defined as being the surface opposite the free surface provided with the sensor or with the sensitive part. It is intended particularly for interconnecting the component with other components of a circuit, for providing electrical power to it and/or for the exchange of signals.

The invention has applications particularly in the conditioning and in the protection of components with sensors such as, for example, accelerometers or pressure sensors. It also has applications in other components that have a sensitive organ, such as gyrometers, or resonators.

THE PRIOR ART

Components provided with sensors generally have a substrate with one free surface able to be in contact with a given medium for the capture of physical or chemical quantities. The free surface is thus able to be brought into contact with a medium which can prove incompatible with the presence, on the same surface, of electrical terminals. The medium may be chemically aggressive for the terminals or other parts of the component. The medium may also be conductive of electricity and distort measurements, or create a short-circuit.

For these reasons, electrical terminals are generally transferred to a rear surface of the substrate, this surface being protected, if necessary, by an appropriate conditioning. In particular, a first substrate, including the sensor, may be associated with a second substrate bonded onto its rear surface in such a way as to protect the terminals. The second substrate may also serve to protect the sensor. The second substrate may also comprise a part of the sensor, or comprise an electronic circuit associated with the sensor.

In order to make a contact point on the terminals of the rear surface of the first substrate, the technique is well known of providing access holes through the second substrate at the base of these terminals, and of plating the holes.

The space required by the holes, which are of necessity quite wide, is not compatible with a high density of input-output terminals. Moreover, the holes give the rear surface of the second substrate a relief which is inappropriate to subsequent stages in the manufacture of conducting strips or other components. Finally problems of filling the holes or problems of blocking may arise when they are plated. Plating the holes can also pose problems of reliability when the component is to be subject to high temperature heat treatments during subsequent process stages.

DISCLOSURE OF THE INVENTION

The purpose of the present invention is to propose a process that does not have the limitations or problems mentioned above.

A particular purpose is to propose a process that makes it possible to guarantee excellent protection of a component against all chemical, or mechanical, aggression. The purpose is also to guarantee a reliable contact point on its terminals.

Another purpose is to facilitate the transfer of the electrical contacts to the rear surface of the component and to allow a high density connection.

Another purpose of the invention is to propose a multiple substrate component, with at least one contact point on the rear surface, and having a rear surface that is plane.

To achieve these purposes, the subject of the invention is more accurately a process of implementing a contact point on the rear surface of a component including at least one first substrate with at least one active region, and at least one second substrate, serving as protection for the active region. In accordance with the invention, a second non-insulating substrate is used and in it is made at least one through insulation barrier surrounding one part of this substrate, the barrier being located in such a way that said part of the substrate is in contact with the active region when the first and second substrates are assembled.

The insulation barrier may be constituted by any insulation joint which surrounds one part of the second substrate. It may particularly be constituted by a trench, which is or is not lined with insulating material.

In the following description, it is assumed that the insulating barrier or barriers are formed by trenches.

By "active region" is understood, in terms of the invention, any part of a component able to be associated in its operation with a contact point and/or with an electrical connection terminal. The active region may be, for example, a conductive layer part, a capacitor plate, an electrode, or a transistor part. The active region may also form a chamber of a pressure sensor.

Furthermore, by "non-insulating" is denoted a conductive, semi-conductive or electrically resistive material, able to conduct electric charges. The substrate is considered as including one or more layers of such materials.

The part of the substrate surrounded by the insulating trench constitutes a pillar which passes right through the substrate and which transfers the contact made on the active region to a rear surface of the device which finds itself to be the free surface of the second substrate.

The pillar is conductive of electricity in so far as it is simply delimited in the second substrate in a non-insulating material.

The pillar also has the advantage of having a free end located exactly in the plane of the rear surface, in other words the free surface of the second substrate. This characteristic greatly facilitates the subsequent implementation of interconnection tracks to connect different pillars to each other or to connect them to other components or terminals.

Moreover, the implementation of a contact point as described above does not require the formation of a contact sink through a second insulating substrate. It thus eliminates the difficulties of filling these sinks with an electrically conductive material.

Finally, the pillar delimited in the mass of the second substrate is particularly insensitive to any heat treatments that might be associated with subsequent component completion stages.

The pillar insulation trench may be made in the second substrate after it is assembled with the first substrate. In this event, the etching of the second substrate may take place with a barrier on the first substrate, that is possibly equipped with an etching barrier layer provided to this end, for example a layer of aluminium or of chrome.

However, according to a preferred embodiment of the invention, which is easier to implement, the trench may be made in the second substrate prior to assembly.

The trench or the trenches may be etched in the second substrate through one of the surfaces or through both surfaces.

It is possible, for example, to make first of all a trench from one surface of the second substrate that does not pass right through and then to proceed to thin down the substrate from the second surface until the trench is opened up.

The techniques able to be implemented for etching the trenches, but also filling them are known per se. Reference may be made on this subject to the document (1) the reference for which is given at the end of the description.

As mentioned above, the trench or trenches may be lined with an electrically insulating material. They may also be kept empty or, more accurately, filled with air.

The trenches may be partially or completely lined, for example, by thermal oxidation of their sides, by oxide deposition, by association of an oxide lining coating the trench sides or of a polysilicon core, or again, by means of insulating glass which is melted in the trenches.

According to one improvement made to the invention, it is further possible to carry out a passivation of one surface of the first substrate intended to come into contact with the second substrate, and to form a contact block electrically connected to the active region, and flush with said surface. In the same way, it is also possible to carry out a passivation of one surface of the second substrate intended to come into contact with the first substrate and to form a contact block electrically connected to the part of the second substrate surrounded by the trench, in other words the pillar mentioned above. This block is then flush with said surface of the second substrate.

The use of contact blocks allows materials to be used that have good conductivity, in the contact area between the pillar and the active region.

The choice of materials for the blocks may also be dictated by the requirement for a good quality mechanical and electrical contact. In particular, the active region and/or the pillar may be provided with contact blocks of different materials, able to alloy together. In this event, the blocks may be in contact by means of a layer of alloy formed from these materials.

This is the case for example when a titanium block is used on the first substrate, in contact with the active region and when the block is transferred against a silicon contact pillar of the second substrate. During the assembly of the first and second substrates a heat treatment may be applied to cause the formation of a titanium silicide at the pillar—block interface.

The invention also relates to a component including a first substrate with at least one active region and a second substrate integral with the first substrate and covering the active region. In accordance with the invention, the second substrate comprises at least one pillar of a electrically conductive material, electrically insulated from a remaining part of the second substrate, in electrical contact with the active region, and passing right through the second substrate. The contact point is formed by the end of the pillar being flush with the rear surface of the component, in other words on a free surface of the second substrate.

Other characteristics and advantages of the invention will emerge from the following description, with reference to the figures in the appended drawings. This description is given purely by way of example and non-restrictively.

DETAILED DESCRIPTION OF EMBODIMENTS OF THE INVENTION

In the following description, parts that are identical, similar or equivalent in the different figures are identified by the same reference indicators to make them easier to read. Furthermore, and in the interests of clarity in the figures, all the elements are not shown according to a uniform scale.

Figure 1:
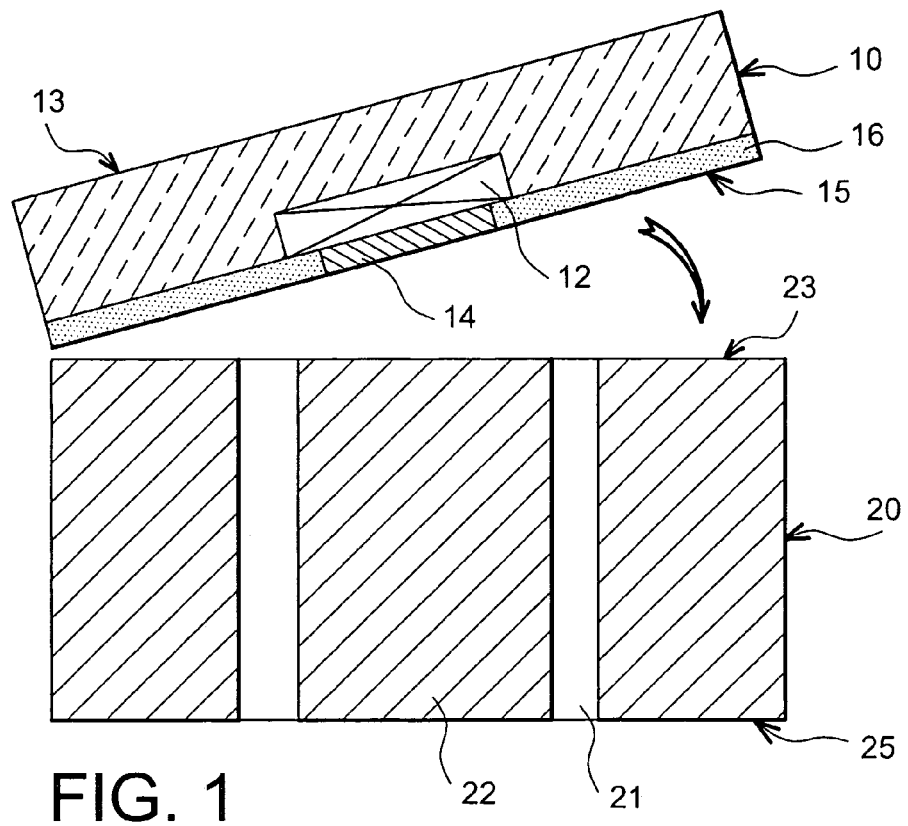
FIG. 1 is a diagrammatic cross-section of two substrates and shows their assembly with a view to the formation of a component according to the invention.

FIG. 1 shows a first substrate 10 which comprises an active region 12. The latter constitutes, for example, a part of a sensor such as an accelerometer.

The active region is associated with a contact block 14 which constitutes an electrical terminal. This is, for example, a terminal connected to the plate of an electrical capacitor used for detecting acceleration.

The block 14 is embedded in a passivation layer 16 formed on a rear surface 15 of the first substrate 10. The block 14 is, for example, made of a metal or polycrystalline silicon. It is deposited in a consonant way in an opening made in the passivation layer 16, and is in electrical contact with the active region. Possible planishing of the rear surfaces 15 makes it possible to render the surface of the passivation layer, and that of the block, perfectly coplanar.

The passivation layer, made of an electrically insulating material, such as, for example, silicon oxide, allows the rear surface of the component, and particularly the active region, to be protected against any aggression from the environment. It also allows electrical insulation to be provided to prevent any short-circuiting between different parts of the first substrate when it is brought into contact with the second substrate. When the first substrate 10 is not insulating, the passivation layer again prevents it from electrically connecting the pillar to the remaining part of the second substrate.

It may be noted that, according to the applications envisaged, the active region, or at the very least the device of which it is part, can extend as far as the free surface 13 of the first substrate 10 which is here the surface opposite the rear surface 15 bearing the passivation layer 16. This is, for example, the case of sensors which have to have a contact surface with the medium to which the measurements to be taken are related.

A second substrate 20 made of a non-insulating material is provided. This is, for example, a silicon substrate. One of the functions of this substrate is to protect the rear surface 15 of the first substrate 10 and particularly the contact block and/or the active region which are flush with it. The second substrate 20 is also used as a means of electrical wiring to bring back one or more electrical contacts to the rear surface of the finished component.

A trench 21 made in the substrate allows a pillar 22 which extends right through the substrate to be delimited therein. More exactly, the pillar extends from a transfer surface 23 which is intended to come into contact with the first substrate as far as an opposite free surface 25, also designated as a "rear surface".

The essential function of the trench is to provide electrical insulation for the pillar. It can be filled with air. It can also be filled wholly, or only in part, with an electrically insulating material.

As will appear again further on in the description, the trench 21 may firstly be made in the second substrate, from its transfer surface, without entirely passing through the substrate. This allows the pillar 22 to be held in place until the first and second substrates are made integral. At this point abrasion of the free surface of the second substrate allows the trench to opened up. The pillar is then held in place by the first substrate.

The width of the trench may be set as a function of the thickness of the substrate. It is, for example, between one tenth and one fiftieth of the thickness of the substrate. By way of illustration, for a substrate 500 μm thick, trenches 50 μm wide may be made.

In FIG. 1, an arrow shows the transfer of the first substrate to the second. The substrates are made integral by transferring them one onto the other in such a way as to bring the rear surface 15 of the first substrate and the transfer surface 23 of the second substrate into contact and in such a way as to make the pillar 22 coincide with the contact block 14, in other words with the active region. When the active region itself has a flush conductive part, the contact block 14 may possibly be omitted.

The seal between the first and second substrates may be a direct seal by molecular adhesion. An intermediary adhesive can also be used.

It may be noted that the free surface 13, 25, of one at least of the substrates, may be integral with a substrate forming a handle (not shown) until the first and second substrates are integral. The surface is then made free by detaching the substrate under consideration from the substrate forming a handle.

Figure 2:
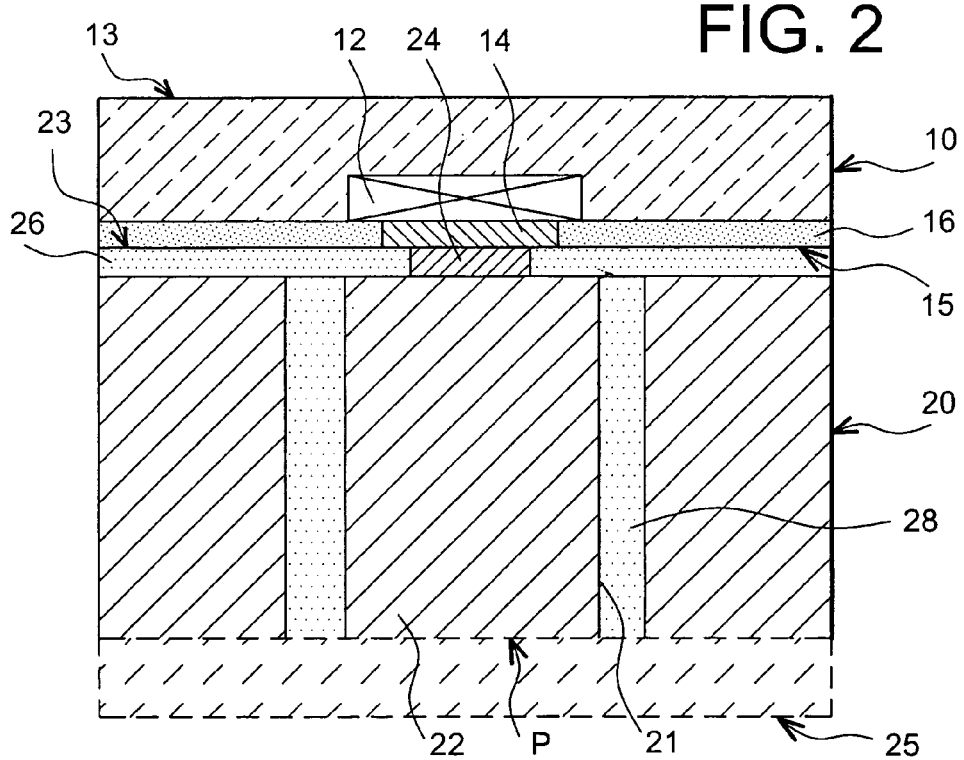
FIG. 2 is a diagrammatic cross-section of another assembly of substrates for making a component according to the invention.

FIG. 2 shows a component in accordance with the invention, for which the manufacture is not entirely complete but for which the first and second substrate 10, 20 are already assembled.

Like the first substrate in FIG. 1, the first substrate 10 in FIG. 2 includes a passivation layer 16 with a conductive block embedded in it. The block 14 is in contact with an active region 12 shown symbolically.

Unlike the second substrate 20 in FIG. 1, the second substrate 20 in FIG. 2 has on its transfer surface 13 a passivation layer 26. This is a layer of electrical insulant. Preferably, when the second substrate is of silicon, the passivation layer 26 may be a layer of $SiO_2$.

The passivation layer has an opening corresponding to the conductive pillar 22. In this opening is embedded a contact block 24. This is a block comparable to the contact block 14 of the first substrate, made of an electrically conductive material (metal, poly-Si). It is flush with the surface of the passivation layer 26.

When the substrates are assembled, the block 14 of the first substrate 10 is brought into contact with the block 24 of the second substrate 20. They thus form an electrical link between the active region and the pillar 22. Outside the contact blocks, the passivation layers 16 and 26 of the two substrates are also in contact. This makes it possible to guarantee better electrical insulation between the two substrates, outside the pillar-active region contact.

As indicated previously, and in accordance with a particular choice, the contact blocks can be made of materials able to alloy together easily when they are brought into contact. This is the case, for example, for pairs of materials such as Si and Ti or Si and Pd.

It can be seen in FIG. 2 that the trench 21 contains an insulating material 28. This is, for example an insulating glass, or an oxide formed by chemical vapour deposition, which fills the trench in a consonant way. As an alternative, the trench may also be lined with a thermal oxide layer then filled with a material which is not necessarily insulating, such as polycrystalline silicon.

The trench 21 of the second substrate is etched from the transfer surface 23, and perpendicularly to this surface, as far as a depth corresponding to ⅔ or ¾ of the overall thickness of the second substrate. The trench is etched, and is likewise also lined, prior to the assembly of the substrate.

After assembly, in other words after a component is obtained in accordance with FIG. 2, the free rear surface 25 can be planished, for example by mecano-chemical abrasion, until the trench and the end of the pillar which forms a contact point P are revealed. The function of the abrasion operation is to perfect the electrical insulation of the contact pillar 22.

The part of the second substrate eliminated during abrasion is shown in broken lines.

Figure 3:
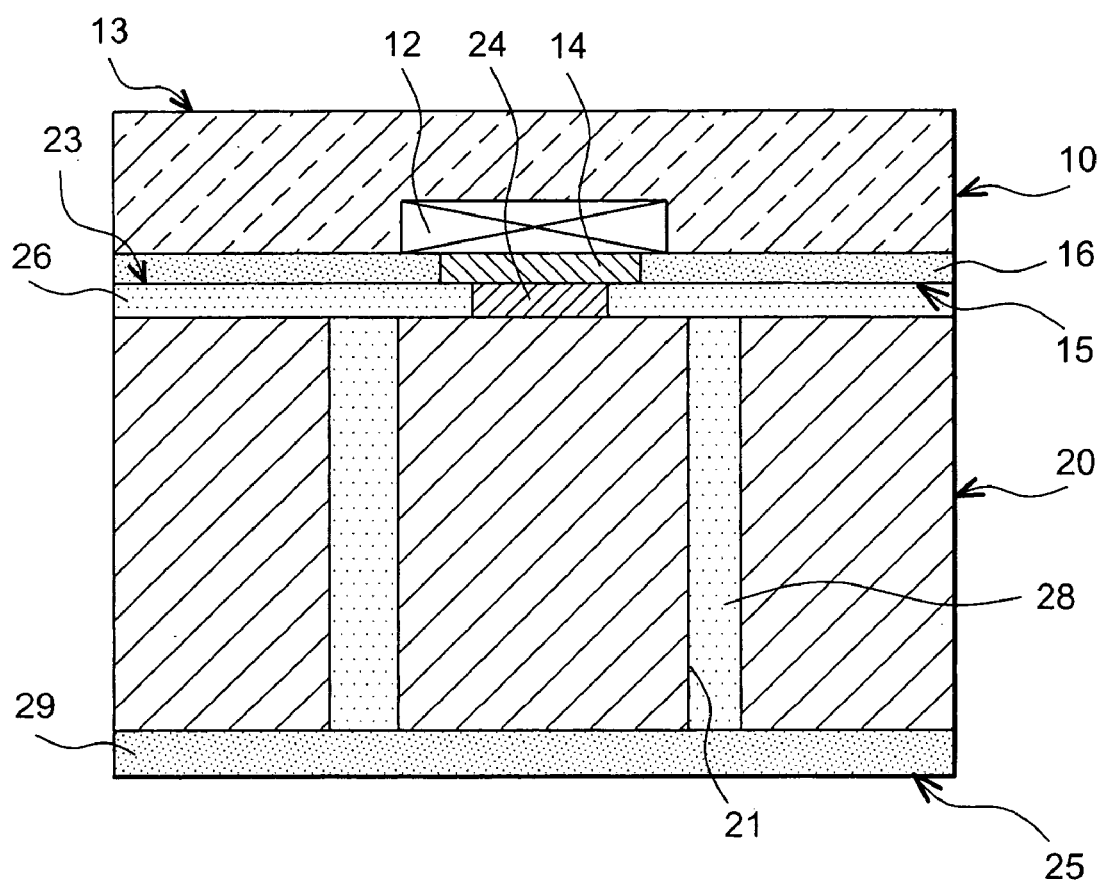
FIG. 3 is a diagrammatic cross-section of a component, also according to the invention.

FIG. 3 shows the component in FIG. 2 after the planishing operation, and after the formation on the rear surface 25 of a passivation layer 29 of an electrically insulating material. An opening (not shown) can be made in the passivation layer 29 to make contact on the pillar. Additionally, the plane nature of the rear surface of the component lends itself well to implementing other lithography operations, for the formation, for example, of interconnecting tracks.

In the preceding description, reference is made, for reasons of simplification, to a single pillar coming into contact with a single active region. However, the invention may be applied by associating with a plurality of active regions, a plurality of pillars, all insulated from each other.

Document Quoted
(1) FR-A-2 754 386

The invention claimed is:

1. A process for making a contact point on the rear surface of a component including at least one first substrate with at least one active region and at least one second substrate protecting the active region, characterised in that a second substrate of non-insulating material is used and in the second substrate is made at least one through insulation barrier electrically insulating a part of the second substrate, in such a way that said part of the second substrate is in contact with the active region when the first substrate and the second substrates are assembled.

2. The process according to claim 1, wherein at least one through trench forming the insulation baker is made in the second substrate.

3. The process according to claim 2, wherein the trench is made after the first and second substrates are assembled.

4. The process according to claim 2, wherein the trench is made prior to the assembly of the first and second substrates.

5. The process according to claim 2, wherein, prior to assembly, a passivation is carried out of one surface of the second substrate intended to come into contact with the first substrate and a contact block is formed electrically connected to the part of the second substrate electrically insulated by the trench, and flush with said surface of the second substrate.

6. The process according to claim 2, wherein the trench is lined with an electrically insulating material.

7. The process according to claim 2, wherein the through trench is made by etching from two opposite surfaces of the second substrate.

8. The process according to claim 2, wherein the through trench is made by etching from a single surface of the second substrate.

9. The process according to claim 8, wherein a trench which does not pass right through is made from one surface of the second substrate and the second substrate is thinned down from an opposite surface until the trench is opened up.

10. The process according to claim 1, wherein, prior to assembly, a passivation is carried out of one surface of the first substrate intended to come into contact with the second substrate and a contact block is formed electrically connected to the active region, and flush with said surface.

11. A process comprising:
forming an active region within a first substrate, a first electrical terminal formed on a surface of the first substrate, the first electrical terminal in contact with the active region;
forming an insulation baker within a second substrate, the second substrate comprised of a non-insulating material, the insulation barrier electrically insulating a portion of the second substrate, the electrically insulated portion of the second substrate extending from a first surface of the second substrate to a second surface of the second substrate opposite the first surface; and
coupling the first substrate to the second substrate so that the first electrical terminal of the first substrate contacts the electrically insulated portion of the second substrate at the first surface of the second substrate, the electrically insulated portion of the second substrate forming a contact point at the second surface of the second substrate.

12. The process of claim 11 wherein the insulation barrier comprises a trench formed through the second substrate.

13. The process of claim 12 wherein at least a portion of the trench is filled with one or more materials providing electrical insulation.

14. The process of claim 13 wherein the one or more materials providing electrical insulation are selected from the group consisting of an insulating glass, an oxide formed through a chemical deposition process, and a filled thermal oxide layer lining the trench.

15. The process of claim 11 further comprising:
forming a first electrically insulating layer upon the surface of the first substrate, the electrically insulating layer coplanar with the first electrical terminal.

16. The process of claim 15 further comprising:
forming a second electrically insulating layer upon the first surface of the second substrate, the second electrically insulating layer having embedded therein a second electrical terminal in contact with the electrically insulated portion of the second substrate.

17. The process of claim 16 wherein the first electrical terminal is comprised of silicon and the second electrical terminal is comprised of a material easily alloying with silicon.

18. The process of claim 17 wherein the second electrical terminal is comprised of a material selected from the group consisting of palladium and titanium.

19. The process of claim 11 wherein the insulation barrier comprises a trench formed partially through the second substrate further comprising:
planishing the second surface of the second substrate to produce the electrically insulated portion of the second substrate.

20. The process of claim 11 further comprising:
forming a third electrically insulating layer upon the second surface of the second substrate.

* * * * *